(12) United States Patent
Halamik et al.

(10) Patent No.: US 6,605,978 B1
(45) Date of Patent: Aug. 12, 2003

(54) METHOD OF FORMING A VOLTAGE DETECTION DEVICE AND STRUCTURE THEREFOR

(75) Inventors: Josef Halamik, Roznov (CZ); Frantisek Sukup, Zasova (CZ)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 10/254,274

(22) Filed: Sep. 25, 2002

(51) Int. Cl.[7] .............................. H03K 17/687
(52) U.S. Cl. ........................ 327/430; 327/427
(58) Field of Search ................. 327/430, 431, 327/427, 434–437, 574, 581, 374–377, 309, 327, 328

(56) References Cited

U.S. PATENT DOCUMENTS

| | | | | |
|---|---|---|---|---|
| 4,492,883 A | * | 1/1985 | Janutka | 327/377 |
| 4,716,356 A | * | 12/1987 | Vyne et al. | 327/362 |
| 5,360,979 A | * | 11/1994 | Joseph et al. | 327/377 |
| 6,373,318 B1 | * | 4/2002 | Dohnke et al. | 327/427 |
| 6,535,050 B2 | * | 3/2003 | Baudelot et al. | 327/430 |

* cited by examiner

*Primary Examiner*—Toan Tran
(74) *Attorney, Agent, or Firm*—Robert Hightower, Atty.

(57) ABSTRACT

A voltage detection device (10, 30) utilizes grounded gate J-FET transistors (16,17,18) to detect desired input voltage values. The grounded gate J-FET transistors (16,17,18) function in different modes as the input voltage varies to facilitate detecting the desired input voltage values.

16 Claims, 3 Drawing Sheets

METHOD OF FORMING A VOLTAGE DETECTION DEVICE AND STRUCTURE THEREFOR

BACKGROUND OF THE INVENTION

The present invention relates, in general, to electronics, and more particularly, to methods of forming semiconductor devices and structure.

In the past, the electronics industry utilized various methods and techniques to form voltage detection circuits. Such voltage detection circuits were used to determine when an input voltage reached a particular desired operating voltage value. One particular usage for such voltage detection circuits was in power supply applications where it was important to detect that the incoming voltage reached a particular value before turning on the power supply regulators and other circuitry. Typically such voltage detection circuits utilized a resistive voltage divider to form a voltage reference value. A differential comparator circuit compared the reference value to the value of the incoming voltage in order to determine if the incoming voltage had reached the reference value.

One particular problem with these voltage detection circuits was power dissipation. The resistor divider typically dissipated substantial amounts of power. Additionally, the comparator also consumed power. Such prior voltage detection circuits typically consumed at least three hundred to five hundred micro amps of current. Additionally, the voltage divider consumed large amounts of area on a semiconductor die. In order to lower the power dissipation, large value resistors were utilized in the voltage divider. Such large value resistors further consumed semiconductor area, thereby increasing the cost of the voltage detection circuits.

Accordingly, it is desirable to have a method of forming a voltage detection circuit that reduces power dissipation and current consumption, that reduces semiconductor die area usage, and that reduces costs.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

The present description includes, among other features, a method of forming a voltage control system having a voltage detector device that is formed to have, among other features, reduced power dissipation and that occupies a small area on a semiconductor die.

Figure 1:
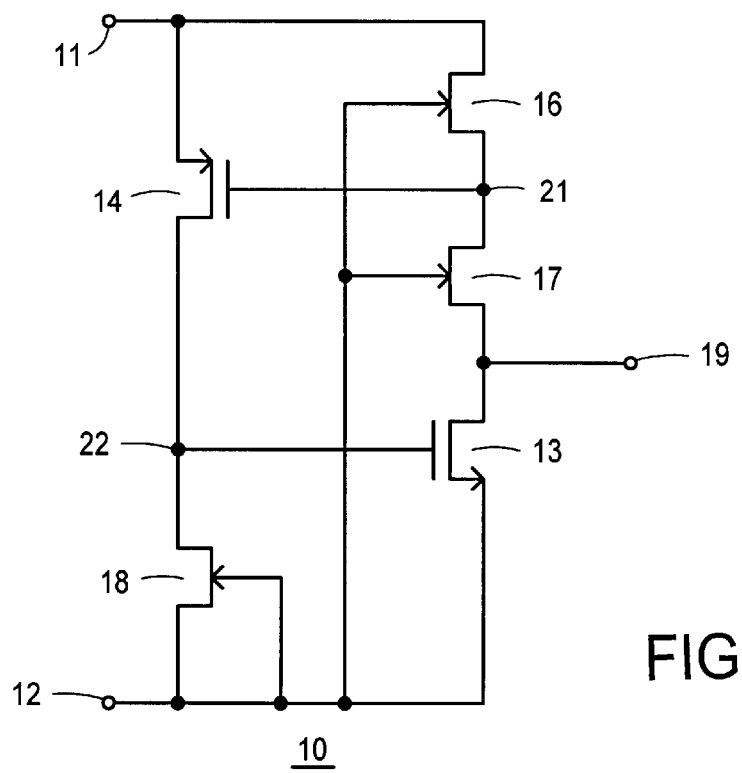
FIG. 1 schematically illustrates an embodiment of a portion of a voltage detector formed by a method in accordance with the present invention.

FIG. 1 schematically illustrates an embodiment of a portion of a voltage detection device or voltage detector 10 that has low power consumption and small die area utilization. Detector 10 is formed to monitor the value of an input voltage and provide an output signal on an output 19 that indicates that the input voltage has reached a desired operating value or a detection voltage. Detector 10 is formed with hysteresis so that a first detection voltage or high detection voltage is established for the case when the input voltage is increasing and a second detection voltage or low detection voltage is established for the case when the input voltage is decreasing. Detector 10 receives an input voltage that is applied between a voltage input 11 and a voltage return 12. Input 11 and return 12 typically are connected to an unregulated voltage source such as a rectified voltage that is applied to a filter capacitor. Such an unregulated voltage source is not shown in FIG. 1 for simplicity of the drawing. Output 19 provides an output signal that can be used by subsequent circuits or stages (for example, see FIG. 3).

Detector 10 is formed to include a first junction field effect transistor (J-FET) 16, a second J-FET transistor 17, and a third J-FET transistor 18, preferably N-channel J-FET transistors, that are connected in a configuration often referred to as a grounded gate configuration. Typically, the J-FET gate is connected to the J-FET substrate in the grounded gate configuration. Other J-FET transistor configurations may be utilized for transistor 16, 17, and 18 as long as the configuration functions as a ground gate. In the preferred embodiment, transistors 16, 17, and 18 are implemented as pinch resistors. Pinch resistors are well known to those skilled in the art. Transistors 16, 17, and 18 may be formed from a variety of implementations including forming the channel, source, and drain regions from a first semiconductor layer that is surrounded by another layer or sandwiched between two or more layers. For example, the source, drain, and channel regions can be formed from any N-type layer, and preferably are formed from the layer forming the well containing the J-FET. The gate can be formed from any P-type layer. Preferably the top of the gate is formed from either shallow or deep P-type regions or layers, and the bottom of the gate is formed from the substrate. Since transistors 16, 17, and 18 are J-FET transistors, it will be noted that the transistors can be formed symmetrically, thus, the source and drain may be interchangeable. In such a case, source and drain nomenclature would designate traditional current flow and would not represent physical transistor characteristic limitations. In the preferred embodiment, transistors 16, 17, and 18 are formed symmetrically. Detector 10 also includes a lower output transistor 13, and a threshold transistor 14. In the preferred embodiment, transistor 13 is an N-channel metal oxide semiconductor (MOS) field effect transistor and transistor 14 is a P-channel MOS transistor.

In operation, when power is initially applied the value of the input voltage applied to input 11 is near zero. Transistors 16, 17, and 18 are all enabled or turned-on and initially function in the triode mode as the input voltage begins increasing from zero. Transistor 18 functions as a resistor and remains turned-on throughout the operation of detector 10, however the operation mode of transistor 18 alternates between the triode and saturation modes as will be seen hereinafter. The J-FET implementation of transistor 18 utilizes a much smaller area than the area of a resistor having the same resistance as transistor 18. Because transistors 16 and 17 are in the triode mode and the drain current is very small compared to the maximum drain current, output 19 is coupled to input 11 through transistors 16 and 17, and the value of the input voltage is applied to output 19. Transistors 16 and 17 remain turned-on in the triode mode as long as the value of the input voltage is less than the pinch-off voltage of transistor 17. As the value of the input voltage reaches the pinch-off voltage of transistor 17, transistor 17 begins operating in the pinch-off mode, thus, transistor 17 is non-conductive and the source becomes clamped to the pinch-off voltage of transistor 17. Thus, output 19 becomes clamped to the pinch-off voltage of transistor 17. Preferably, transistor 17 operates in the cut-off region of the pinch-off mode. Transistor 16 remains in the triode mode until the input voltage increases further. Since transistor 16 remains in the triode mode, a node 21 continues to follow input 11 until the input voltage value reaches the pinch-off voltage of transistor 16. At this input voltage value, transistor 16 also begins operating in the pinch-off mode. Preferably, transistor 16 also is in the cut-off region of the pinch-off mode. Consequently, the output voltage on output 19 starts at zero and increases until it reaches the value of the pinch-off voltage of transistor 17. This represents a high output value for output 19 and is used to signal that the input voltage has not reached the high detection voltage. The pinch-off voltage value for transistor 17 is chosen to be smaller than the pinch-off voltage of transistor 16 to ensure that transistor 17 sets the high output voltage value for detector 10. The pinch-off voltage value for transistor 17 is also chosen to provide the desired high output value on output 19.

As the value of the input voltage continues to increase and reaches a value equal to the pinch-off voltage of transistor 16 plus the gate-to-source threshold voltage of transistor 14, transistor 14 turns-on and current begins to flow from input 11 through transistors 14 and 18 to return 12. Transistor 18 functions as a current sink or current sinking resistor for transistor 14. Transistor 18 is formed so that the current flow ensures that the drain current provides a voltage at node 22 that is sufficient to turn-on transistor 13. The current typically causes transistor 18 to begin operating in the drain current saturation mode instead of the triode mode. Turning-on transistor 13 connects output 19 to return 12, consequently, the value of output 19 becomes approximately equal to the value of return 12. In the preferred embodiment, return 12 is connected to a ground potential. This voltage value represents a low output value and is used to signal that the input voltage reached the high detection voltage. The value of the pinch-off voltage of transistor 16 plus the threshold voltage of transistor 14 are chosen to equal the minimum desired high detection voltage value at which output 19 switches from a high output value to a low output value. These parameters may be varied to provide the desired high detection voltage.

Connecting output 19 to return 12 also connects the source of transistor 17 to return 12 thereby turning-on transistor 17 to function as a current sink or a load for transistor 16. As transistors 17 and 13 begin to conduct current, transistor 16 must also conduct current which forces transistor 16 out of the pinch-off mode and into the drain current saturation mode. Transistor 16 has a gate-to-source voltage that is greater than zero but is less than the pinch-off voltage of transistor 16. Transistor 17 has a gate-to-source voltage that is approximately equal to zero. Transistor 17 is functioning as a load for transistor 16 and the size of transistor 17 or the width to length ratio of transistor 17 is formed to ensure that the voltage dropped across transistor 17 is equal to the maximum input voltage applied to input 11 minus the saturation voltage dropped across transistor 16. The length and width of transistor 17 are also formed to assist in achieving the desired pinch-off voltage for transistor 17. The length and width of transistor 16 are formed to assist in achieving the desired pinch-off voltage and to ensure that transistor 16 operates in the drain current saturation mode when providing the current required by transistor 17. Consequently, the output voltage of detector 10 follows the input voltage as it increases from zero until the input voltage reaches the value of the pinch-off voltage of transistor 17. When the input voltage reaches the desired high detection voltage, the output voltage decreases to approximately the voltage on return 12.

When the input voltage begins to decrease, the output voltage on output 19 initially remains constant. When the input voltage decreases to a value less than the voltage of node 21, transistor 14 turns off. It should be noted that node 21 is loaded by transistor 13, thus, the voltage on node 21 is less than the pinch-off voltage of transistor 16. Transistor 18 remains enabled and since no current is flowing through transistor 18, the value at node 22 becomes approximately the value of return 12. Consequently, transistor 13 also turns off. Transistors 16 and 17 no longer have to support current flow through transistor 13, thus, transistors 16 and 17 are once again forced into the pinch-off mode. As long as the input voltage is greater than the pinch-off voltage of transistors 16 and 17, transistor 17 clamps output 19 to the value of the pinch-off voltage of transistor 17, thereby forcing output 19 to the high output value. Thus the size of transistor 17 plus the threshold voltage of transistor 14 establishes the low detection voltage at which output 19 becomes a high value as the input voltage is decreasing. As the value of the input voltage continues to decrease below the pinch-off voltage of transistors 16 and 17, transistor 16 and transistor 17 are forced to operate in the triode mode and couple output 19 to input 11, thus, the output voltage follows the input voltage value as it decreases to zero. It should be noted that if the loaded voltage at node 21 is less than the pinch-off voltage of transistor 17, then transistors 16 and 17 are forced directly into the triode mode without transitioning through the pinch-off mode. In such a case, output 19 follows the input voltage directly instead of first being clamped by transistor 17.

Thus it can be seen from the previous description that transistor 17 is formed to have a pinch-off voltage that provides the desired high level output voltage value. The pinch-off voltage of transistor 16 plus the threshold voltage of transistor 14 is formed to provide the desired high detection voltage value. The size of transistors 16 and 17 are formed to ensure that transistor 16 does not operate in the pinch-off mode when transistor 16 is conducting the current required to drop the input voltage across transistor 17 in order to ensure that output 19 changes state when the desired high detection voltage is reached. The size of transistor 17 is also formed to ensure that output 19 remains at the low output value until the input voltage decreases to a low detection value.

In one example, detector 10 is formed to accept an unregulated input voltage that reaches a full wave rectified waveform that varies from twelve volts (12V) to a maximum of approximately eighteen volts (18V). The input voltage initially begins at zero volts before power is applied. Output 19 is formed to provide a low or ground voltage when the input voltage reaches a value of approximately twelve volts (12V). To provide the desired twelve volt detection, transistor 16 is formed to have a pinch-off voltage of approximately ten volts (10V). Transistors 13 and 14 are formed to have a threshold voltage of approximately two volts (2.0 V) each. The size of transistors 16 and 17 are formed to provide a current flow that ensures transistor 16 is reset from operating in the pinch-off mode and operates in the triode mode when transistor 17 is enabled by transistor 13. Transistor 16 is formed to have a length of approximately nine (9) microns and a width of approximately twelve (12) microns in order to ensure transistor 16 does not operate in the pinch-off mode when supplying the current required by transistor 17. Transistor 17 is formed to have a width of approximately nine (9) microns and a length of approximately fifty (50) microns in order to sink approximately ten micro-amps of current from transistor 16. Transistor 18 is formed to have a width of approximately nine (9) microns and a length of approximately fifty (50) microns in order to provide a resistance sufficient drop the input voltage value across transistor 18 at the source current provided by transistor 14. In operation, the input voltage increases from zero and output 19 follows the input voltage value until the input voltage reaches a value of approximately twelve volts (12V) and output 19 becomes clamped at approximately eight volts (8V). The input voltage continues to increase and reaches a high detection voltage value of approximately twelve volts (12V) and output 19 switches to approximately zero volts. Output 19 remains at approximately zero as the input voltage continues to increase.

When the input voltage begins to decrease, transistors 16 and 17 remain in the drain current saturation mode until the input voltage decreases to the low detection value of approximately ten volts (10 V) set by the size of transistor 17.

In order to facilitate this operation, transistor 16 has a drain connected to input 11, a source connected to node 21, and a gate connected to return 12. Transistor 17 has a drain connected to node 21, a gate connected to return 12, and a source connected to output 19. Transistor 13 has a drain connected to output 19, a gate connected to node 22, and a source connected to return 12. A source of transistor 14 is connected to input 11, a gate is connected to node 21, and a drain is connected to node 22. Transistor 18 has a drain connected node 22 and both a gate and source connected to return 12.

Figure 2:
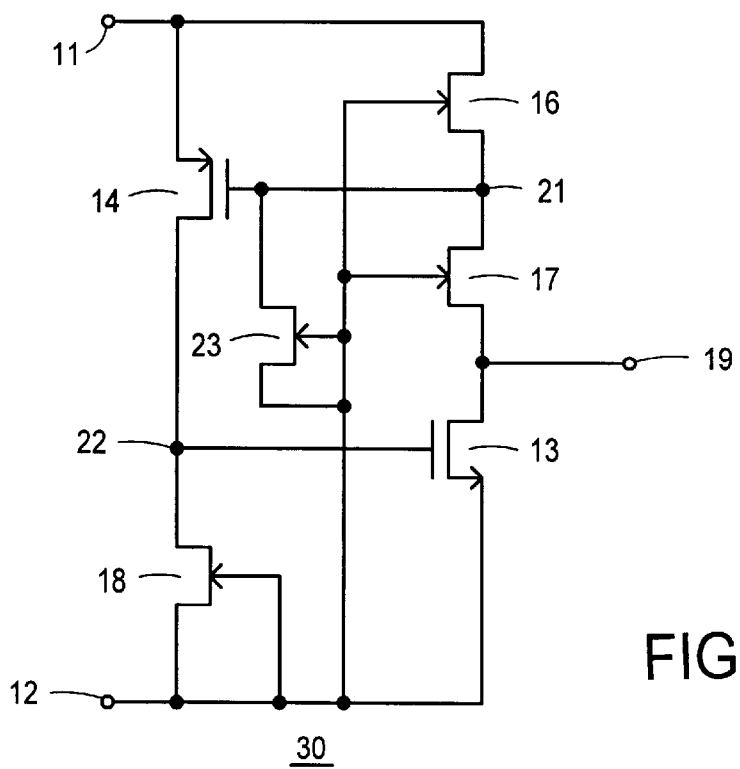
FIG. 2 schematically illustrates an embodiment of a portion of another voltage detector formed by a method in accordance with the present invention.

FIG. 2 schematically illustrates another embodiment of a portion of a voltage detection device or voltage detector 30 that is an alternate embodiment of detector 10 discussed in the description of FIG. 1. Detector 30 includes an additional load transistor 23 that has a drain connected to node 21 and both a source and gate connected to return 12. Transistor 23 is always enabled and functions as a load on transistor 16 and node 21. This load is formed to sink enough current that prevents transistor 16 from operating in the pinch-off mode and forces transistor 16 to operate in the triode mode. Thus, when the input voltage is increasing, transistor 16 does not go into the pinch-off mode, but begins in the triode mode and transitions to the drain current saturation mode as explained in the description of FIG. 1. When the input voltage is decreasing, transistor 16 does not go into the pinch-off mode, but begins in the drain current saturation mode and transitions to the triode mode as explained in the description of FIG. 1.

Figure 3:
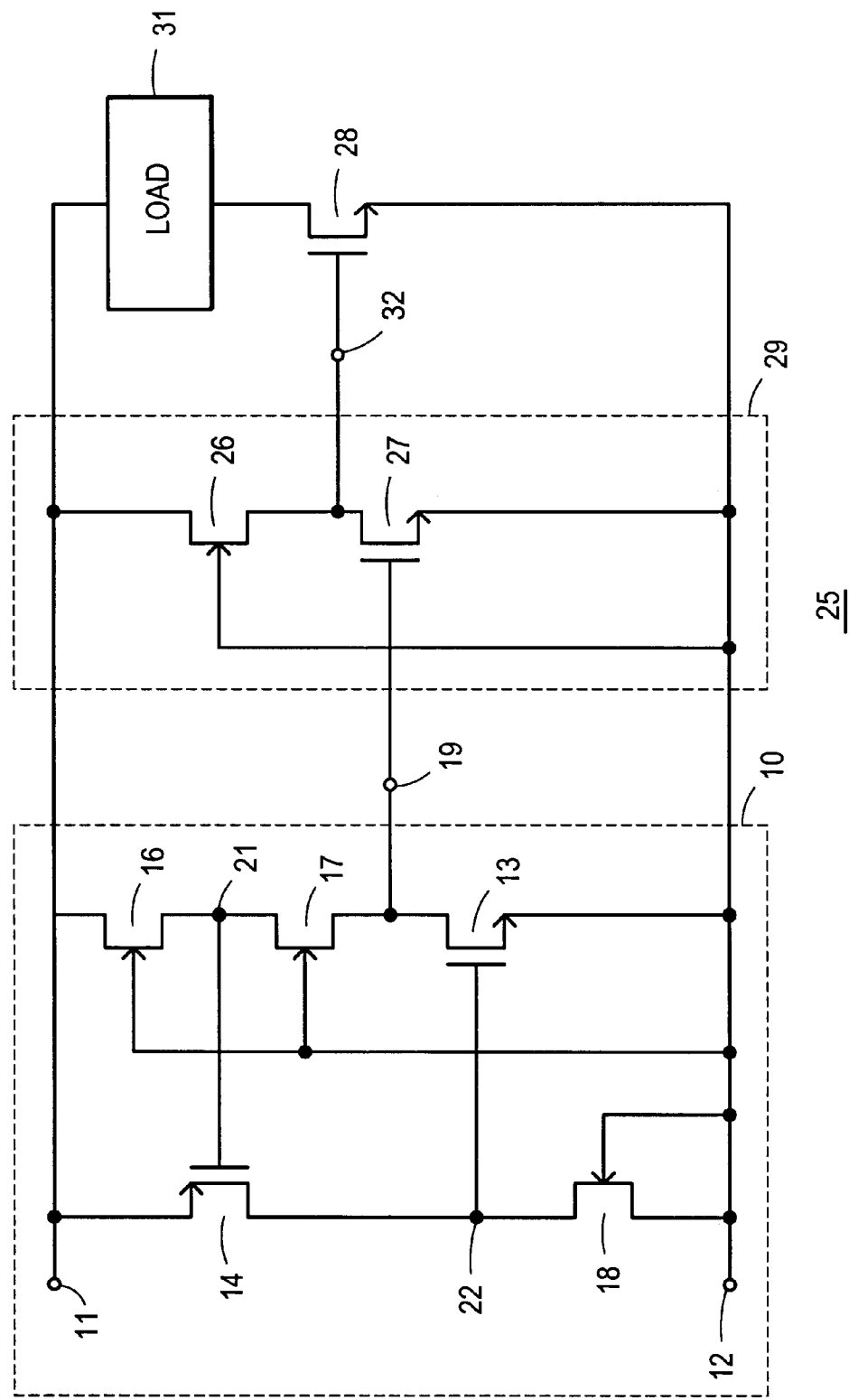
FIG. 3 schematically illustrates a portion of an embodiment of a voltage control system utilizing the voltage detector of FIG. 1 or FIG. 2 formed by a method in accordance with the present invention.

FIG. 3 schematically illustrates a portion of an embodiment of a voltage control system 25 that utilizes detector 10 of FIG. 1 or detector 30 of FIG. 2. System 25 includes a buffer 29 that receives the output voltage of detector 10 and drives a switch or transistor 28 to switch a load 31 when the input voltage of detector 10 reaches the high detection voltage value. Buffer 29 is formed to include a grounded gate J-FET transistor 26, a switch transistor 27, and an output 32. Transistor 27 is coupled to receive the input voltage on input 11. When the input voltage applied to input 11 is greater than the pinch-off voltage of transistor 26 and when transistor 27 is disabled, transistor 26 clamps output 32 to the pinch-off voltage of transistor 26. This pinch-off voltage is selected to be greater than the minimum gate-to-source threshold voltage of transistor 28 in order to turn-on transistor 28 and facilitate operation of load 31. However, when transistor 27 is enabled by detector 10, output 32 is connected to return 12 and the resulting current through transistor 26 forces transistor 26 out of the pinch-off mode and into the current saturation mode to supply the required current. The low output turns-off transistor 28 and suspends operation of load 31. The width and length of transistor 26 are selected to ensure that the resistance of transistor 26 forms the required voltage at the current required by transistor 27, and to also assist in providing the selected pinch-off voltage for transistor 26. The J-FET configuration is used to minimize both power dissipation and the semiconductor die area used for system 25.

In order to facilitate this operation, transistor 26 has a drain connected to input 11, a gate connected to return 12, and a source connected to output 32. A drain of transistor 27 is connected to output 32, a gate is connected to output 19, and a source is connected to return 12. Transistor 28 has a gate connected to output 32, a source connected to return 12, and a drain connected to load 31.

Figure 4:
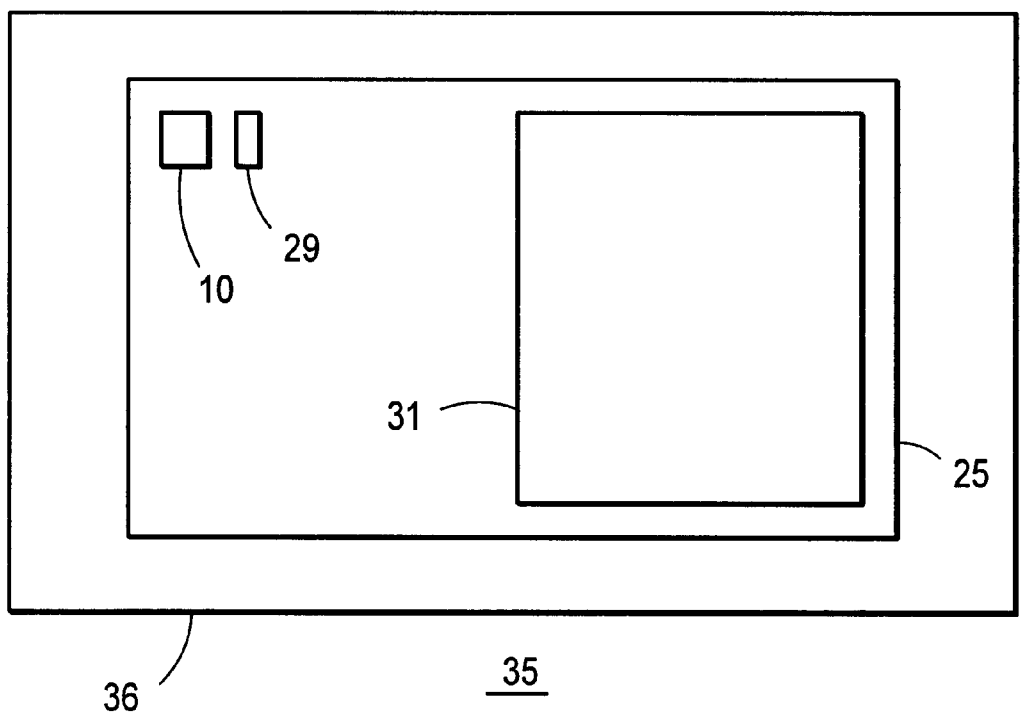
FIG. 4 schematically illustrates an enlarged plan view of an embodiment of a semiconductor device formed by a method in accordance with the present invention.

FIG. 4 schematically illustrates an enlarged plan view of a portion of an embodiment of a semiconductor device 35 that includes detector 10 or detector 30 and system 25 formed on a semiconductor die 36.

In view of all of the above, it is evident that a novel device and method is disclosed. Detector 10 has very low power consumption and uses a small area of a semiconductor die. Because transistors 13 and 14 are turned-off when the input voltage is less than either the high or low detection voltage, detector 10 consumes substantially no current, except for small amounts of leakage current. Additionally, after the input voltage is no less than either detection voltage, detector 10 consumes less power because the J-FET transistors consume less power than resistors of the same equivalent resistance. Furthermore, detector 10 does not have current consuming comparators thereby further lowering power consumption. Detector 10 typically consumes about three orders of magnitude less current than prior circuits. Still further, since J-FET transistors use less area than resistors of the same equivalent resistance, detector 10 is smaller than other detection circuits. Detector 10 typically uses about eighty per cent (80%) less area than prior circuits.

While the invention is described with specific preferred embodiments, it is evident that many alternatives and variations will be apparent to those skilled in the semiconductor arts. For example, the invention has been described for particular N-channel J-FET transistors having certain source and drain connections, however, the channel type and the connections may be changed.

What is claimed is:

1. A method of forming a voltage detection device comprising:

forming a plurality of J-FET transistors coupled to receive an input voltage and responsively operate in a triode mode when the input voltage is less than a first value and to operate in a drain current saturation mode when the input voltage is greater than a second value;

forming a first J-FET transistor of the plurality of J-FET transistors to operate in a pinch-off mode when the input voltage is greater than the first value and less than the second value; and forming a first MOS transistor to receive a voltage of a first current carrying electrode of a second J-FET transistor of the plurality of J-FET transistors and to responsively couple a control electrode of a second MOS transistor to the input voltage.

2. The method of claim 1 wherein coupling the first MOS transistor to receive the voltage of the first current carrying electrode of the second J-FET transistor of the plurality of J-FET transistors and responsively couple the control electrode of the second MOS transistor to the input voltage includes forming the second MOS transistor to receive a voltage of a first current carrying electrode of the second J-FET transistor.

3. The method of claim 1 wherein forming the plurality of J-FET transistors coupled to receive the input voltage and responsively operate in the triode mode when the input voltage is less than the first value and to operate in the drain current saturation mode when the input voltage is greater than the second value includes forming the first J-FET transistor to be a load for the first J-FET transistor after the input voltage is greater than the second value.

4. The method of claim 1 wherein forming the first MOS transistor to receive the voltage of the first current carrying electrode of the second J-FET transistor of the plurality of J-FET transistors and to responsively couple the control electrode of the second MOS transistor to the input voltage includes forming the second MOS transistor to couple the first J-FET transistor to a voltage return.

5. The method of claim 1 further including forming the plurality of J-FET transistors coupled in series and in series with the second MOS transistor.

6. The method of claim 1 wherein forming the first MOS transistor to receive the voltage of the first current carrying electrode of the second J-FET transistor of the plurality of J-FET transistors and to responsively couple the control electrode of the second MOS transistor to the input voltage includes forming a third J-FET transistor as a load for the first MOS transistor.

7. The method of claim 6 further including forming the plurality of J-FET transistors coupled in series and in series with the second MOS transistor.

8. A method of forming a voltage detection device comprising:

coupling an output of the voltage detection device to follow an input voltage when the input voltage is less than a first value;

clamping the output to a first output voltage value when the input voltage is at least equal to the first value and less than a second value by operating a first grounded gate J-FET transistor in a pinch-off mode; and coupling the output to a second output voltage value when the input voltage is at least equal to the second value by operating the first grounded gate J-FET transistor in a drain current saturation mode.

9. The method of claim 8 wherein coupling the output of the voltage detection device to follow the input voltage when the input voltage is less than the first value includes operating the first grounded gate J-FET transistor in a triode mode.

10. The method of claim 8 wherein clamping the output to a first output voltage value when the input voltage is at least equal to the first value and less than the second value includes operating a second grounded gate J-FET transistor in the pinch-off mode.

11. The method of claim 8 wherein clamping the output to a first output voltage value when the input voltage is at least equal to the first value and less than the second value includes operating a second grounded gate J-FET transistor in a triode mode.

12. The method of claim 8 wherein coupling the output to the second output voltage value when the input voltage is at least equal to the second value includes coupling a control electrode of a first MOS transistor to the input voltage when the input voltage is at least equal to the second value.

13. The method of claim 12 further including enabling a second MOS transistor to couple the control electrode of a first MOS transistor to the input voltage.

14. A voltage detection device comprising:

a first grounded gate J-FET transistor having a first current carrying electrode coupled to a voltage input, a control electrode coupled to a voltage return, and a second current carrying electrode;

a second grounded gate J-FET transistor having a first current carrying electrode coupled to the second current carrying electrode of the first grounded gate J-FET transistor, a control electrode coupled to the voltage return and a second current carrying electrode;

a first transistor having a first current carrying electrode coupled to the voltage input, a control electrode coupled to the second current carrying electrode of the first grounded gate J-FET transistor, and a second current carrying electrode; and a second transistor having a first current carrying electrode coupled to the second current carrying electrode of the second grounded gate J-FET transistor, a control electrode coupled to the second current carrying electrode of the first transistor, and a second current carrying electrode coupled to the voltage return.

15. The voltage detection device of claim 14 further including a third grounded gate J-FET transistor having a first current carrying electrode coupled to the second current carrying electrode of the first transistor, a control electrode and a second current carrying electrode coupled to the voltage return.

16. The voltage detection device of claim 14 wherein the first transistor and the second transistor are MOS transistors.

* * * * *